(12) United States Patent
Bahl et al.

(10) Patent No.: US 10,573,610 B2
(45) Date of Patent: Feb. 25, 2020

(54) METHOD FOR WAFER LEVEL PACKAGING

(71) Applicant: CATLAM, LLC, Sunnyvale, CA (US)

(72) Inventors: Kenneth S. Bahl, Saratoga, CA (US); Konstantine Karavakis, Pleasanton, CA (US)

(73) Assignee: CATLAM, LLC, Sunnyvale, CA (US)

( * ) Notice: Subject to any disclaimer, the term of this patent is extended or adjusted under 35 U.S.C. 154(b) by 349 days.

(21) Appl. No.: 15/009,386

(22) Filed: Jan. 28, 2016

(65) Prior Publication Data

US 2016/0148893 A1 May 26, 2016

Related U.S. Application Data

(63) Continuation-in-part of application No. 14/297,516, filed on Jun. 5, 2014, now Pat. No. 9,631,279, which is a continuation-in-part of application No. 14/281,631, filed on May 19, 2014, now Pat. No. 9,380,700.

(51) Int. Cl.
| | |
|---|---|
| H05K 3/02 | (2006.01) |
| H05K 3/10 | (2006.01) |
| H01L 23/00 | (2006.01) |

(52) U.S. Cl.
CPC .............. *H01L 24/03* (2013.01); *H01L 24/05* (2013.01); *H01L 2224/03464* (2013.01); *Y10T 29/49155* (2015.01)

(58) Field of Classification Search
CPC ......... H01L 24/03; H01L 24/94; H01L 24/02; H05K 2201/017; H05K 2203/107; H05K 2201/0236; H05K 2201/0376; H05K 2203/025; H05K 2203/0716; H05K 3/0041; Y10T 29/49126; Y10T 29/49155; Y10T 29/49163; Y10T 29/49165
USPC .......... 29/830, 846, 851, 852; 174/258, 262; 216/13, 17
See application file for complete search history.

(56) References Cited

U.S. PATENT DOCUMENTS

| | | | |
|---|---|---|---|
| 3,322,881 A | 5/1967 | Schneble et al. | |
| 4,287,253 A * | 9/1981 | Leech | ..................... C23C 18/28 174/258 |

(Continued)

FOREIGN PATENT DOCUMENTS

| | | |
|---|---|---|
| EP | 2120525 A1 | 9/2009 |
| EP | 2420593 B1 | 2/2012 |

(Continued)

OTHER PUBLICATIONS

PCT International Preliminary Report on Patentability for PCT Application PCT/US2015/014619, dated Dec. 1, 2016.

(Continued)

*Primary Examiner* — Donghai D Nguyen
(74) *Attorney, Agent, or Firm* — File-EE-Patents.com; Jay A. Chesavage

(57) ABSTRACT

Wafer level packaging includes a first layer of a catalytic adhesive on a wafer surface. The catalytic adhesive includes catalytic particles that will reduce electroless copper (Cu) from $Cu^{++}$ to Cu. Metal traces are formed in trace channels within the first layer of catalytic adhesive. The trace channels extend below a surface of the first layer of the catalytic material. The trace metals traces are also in contact with integrated circuit pads on the surface of the wafer.

18 Claims, 3 Drawing Sheets

(56) References Cited

U.S. PATENT DOCUMENTS

| | | |
|---|---|---|
| 4,954,185 A | 9/1990 | Kohm |
| 5,112,726 A * | 5/1992 | Cohen et al. ......... G03F 7/0047 |
| | | 430/315 |
| 5,162,144 A | 11/1992 | Brown et al. |
| 5,309,632 A | 5/1994 | Takahashi et al. |
| 5,419,954 A * | 5/1995 | Lane ..................... B32B 5/08 |
| | | 442/173 |
| 7,067,454 B2 * | 6/2006 | Raybould ............ B01D 53/885 |
| | | 502/320 |
| 7,169,691 B2 | 1/2007 | Doan |
| 7,319,050 B2 | 1/2008 | Chang et al. |
| 7,334,326 B1 | 2/2008 | Huemoeller et al. |
| 7,632,753 B1 | 12/2009 | Rusli et al. |
| 7,752,752 B1 | 7/2010 | Rusli et al. |
| 8,779,576 B2 | 7/2014 | Park et al. |
| 8,836,144 B2 | 9/2014 | Liao |
| 8,922,014 B2 | 12/2014 | Hu et al. |
| 8,941,222 B2 | 1/2015 | Hunt |
| 9,000,558 B2 | 4/2015 | Sarfaraz et al. |
| 9,000,587 B1 | 4/2015 | Kelkar et al. |
| 9,087,732 B1 | 7/2015 | Xu et al. |
| 9,117,714 B2 | 8/2015 | Weng et al. |
| 9,136,196 B2 | 9/2015 | Rathburn |
| 9,922,951 B1 * | 3/2018 | Bahl ................... C23C 18/1608 |
| 2002/0195716 A1 | 12/2002 | Magnusen et al. |
| 2006/0055021 A1 | 3/2006 | Yamamoto |
| 2006/0057341 A1 | 3/2006 | Kawabata et al. |
| 2006/0068173 A1 | 3/2006 | Kajiyama et al. |
| 2007/0014975 A1 | 1/2007 | Ota |
| 2009/0120660 A1 | 5/2009 | Park et al. |
| 2010/0266752 A1 | 10/2010 | Tseng et al. |
| 2011/0048783 A1 | 3/2011 | Yu |
| 2012/0074094 A1 | 3/2012 | Chiang et al. |

FOREIGN PATENT DOCUMENTS

| | | |
|---|---|---|
| GB | 1208337 A | 10/1970 |
| WO | WO 2009006010 A1 | 1/2009 |
| WO | WO 2012/127205 A1 | 9/2012 |
| WO | WO2014041057 A1 | 3/2014 |

OTHER PUBLICATIONS

PCT International Preliminary Report on Patentability for PCT Application PCT/US2015/014599, dated Nov. 22, 2016.

* cited by examiner

METHOD FOR WAFER LEVEL PACKAGING

BACKGROUND

Wafer level packaging is the technology of packaging integrated circuits fabricated on a wafer without slicing a wafer into individual circuits (dice). The wafer is typically composed of semiconductor material such as crystallized Silicon. Wafer level packaging is in contrast to the more conventional method of slicing a wafer into individual circuits (dice) and then packaging each die individually.

DESCRIPTION OF THE EMBODIMENT

When performing wafer level packaging, dielectric material is often used to separate and insulate metal layers from circuitry formed on substrates and to separate and insulate metal layers from other metal layers. As disclosed further herein as a substitute for use of traditional dielectric material, one or more layers of catalytic adhesive can be used to reduce processing steps necessary for wafer level packaging. A catalytic adhesive is dielectric material that will adhere to a wafer surface and that includes catalytic particles that will reduce electroless copper (Cu) from $Cu^{++}$ to Cu.

For example, wafer level packaging includes a first layer of a catalytic adhesive on a wafer surface. The catalytic adhesive includes catalytic particles that will reduce electroless copper (Cu) from $Cu^{++}$ to Cu. Metal traces are formed in trace channels within the first layer of catalytic adhesive. The trace channels extend below a surface of the first layer of the catalytic material. The metals traces are also in contact with integrated circuit pads on the surface of the wafer.

For example, the metal traces are formed using a metal plating process that includes an electroless copper bath. For example, the catalytic particles are composed of at least one of: palladium (Pd) particles, iron (Fe) particles, and silver (Ag) particles.

For example, the trace channels are formed using laser ablation. Alternatively, the trace channels are formed by applying resist over the first layer of catalytic adhesive, exposing and developing the resist to delineate locations of the trace channels, and performing plasma etching to form the trace channels. Alternatively, the trace channels are formed by applying foil over the first layer of catalytic adhesive, applying resist over the foil, exposing and developing the resist to expose portions of the foil that delineate locations of the trace channels, etching the exposed portions of the foil, and performing plasma etching to form the trace channels.

Additionally, the first layer of catalytic adhesive may be coated with non-catalytic material before forming trace channels in the catalytic adhesive.

For example, a second layer of the catalytic adhesive may be applied over the first layer of the catalytic adhesive and over the metal traces. Trace channels can be formed in the second layer of catalytic adhesive. A metal plating process can be used to form metal traces within the trace channels formed in the second layer of catalytic adhesive.

Figure 1:
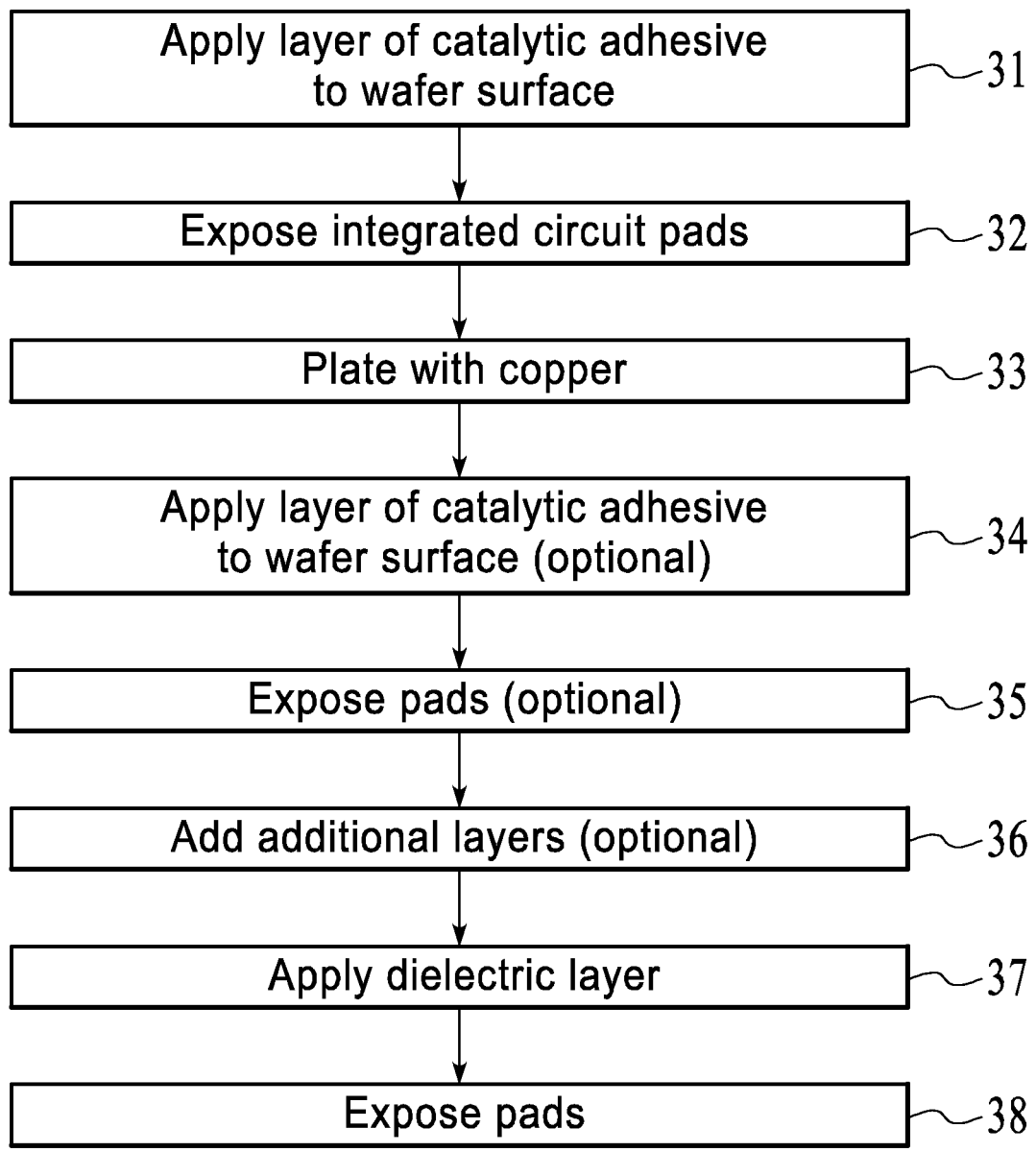
FIG. 1 is a flowchart summarizing a process where a catalytic adhesive is used for wafer level packaging in accordance with an implementation.

FIG. 1 is a flowchart summarizing a process where a catalytic adhesive is used for wafer level packaging.

In a block 31, a catalytic layer of adhesive is applied to a wafer surface. This is illustrated by FIG. 2, FIG. 3 and FIG. 4.

Figure 2:
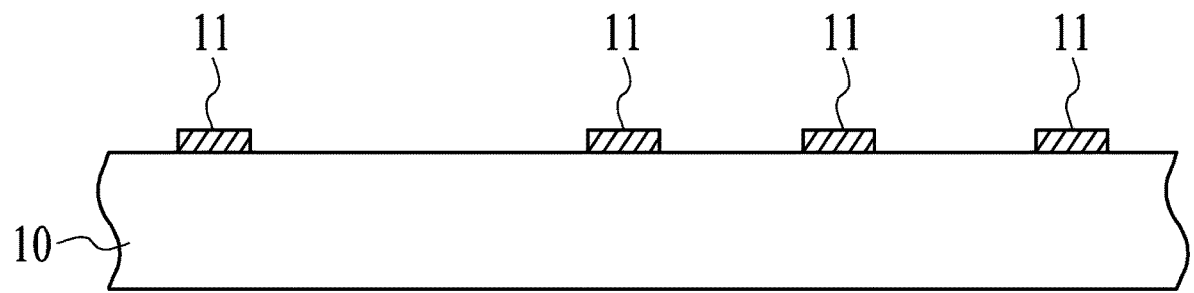
FIG. 2, FIG. 3, FIG. 4, FIG. 5 and FIG. 6 illustrate a process where a catalytic adhesive is used for wafer level packaging in accordance with an implementation.

In FIG. 2, a semiconductor wafer 10 is shown to include integrated circuit (IC) pads 11 for connection to the circuitry formed on semiconductor wafer 10. For example, semiconductor wafer 10 is formed of crystalline Silicon, or a compound semiconductor such as Gallium nitride, Gallium arsenide, Indium arsenide, Zinc selenide, Zinc sulfide, Silicon carbide, Indium selenide or Cadmium sulfide.

Figure 3:
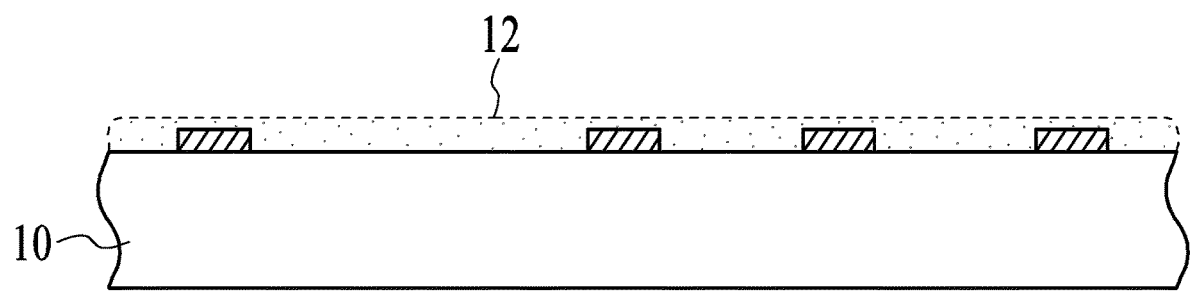
Figure 4:
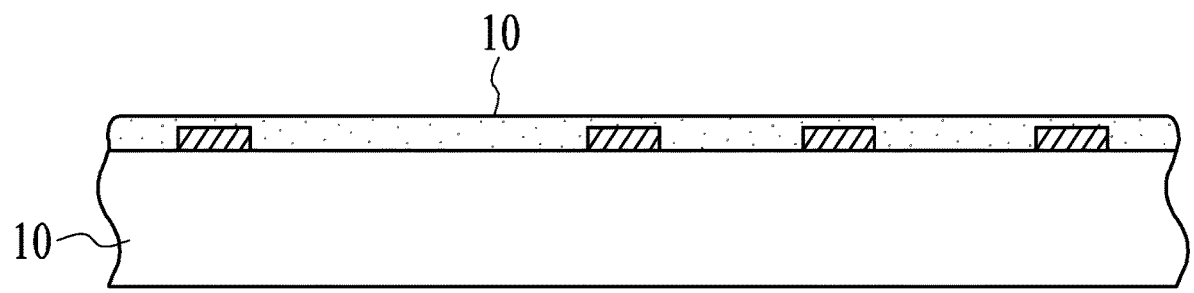

FIG. 3 shows a catalytic adhesive 12 applied over wafer 10. Spin coating or other conventional or non-conventional processes can be used to apply catalytic adhesive 12.

For example, catalytic adhesive 12 is a dielectric adhesive such as an epoxy, polyimide, cyanate ester or another suitable dielectric adhesive. The dielectric adhesive includes, for example, both non-catalytic and catalytic filler particles. The catalytic filler particles are composed of, for example, a metal such as palladium (Pd), iron (Fe), silver (Ag) and/or other catalytic particles used for copper plating where electroless copper (Cu) is reduced from its $Cu^{++}$ to Cu. For example, the catalytic particles can be made of inorganic filler with metal coated over the inorganic filler. For example, the inorganic filler can be silicon dioxide, kaolin, or some other inorganic filler with suitable properties for the particular application.

In one implementation, palladium powder that includes palladium catalytic particles is made out of inorganic fillers primarily Kaolin. For example, the inorganic fillers are produced by contacting a salt palladium, at the surface of a filler such as aluminum silicate, and clays such as Kaolin with a reducing agent. Alternatively, instead of salt of palladium, salt of another metal such as silver can be used.

Hydrazine hydrate can be used as a reducing agent to reduce the palladium salt to palladium metal. The filler can be added into a mixing tank with water in a form of slurry and then a palladium chlorine (PdCl) and hydrochloric acid (HCl) solution added into the mixture followed by the hydrazine hydrate. For more information on making such a catalytic power, see U.S. Pat. No. 4,287,253.

Thickness of catalytic adhesive 12 is dependent on application. For example, catalytic adhesive 12 is 10 microns thick or greater. Alternatively, catalytic adhesive 12 is less than 10 microns thick.

FIG. 4 illustrates wafer 10 after catalytic adhesive 12 has been cured. For example, catalytic adhesive is cured thermally or is cured using ultra violet (UV) light.

Optionally, a coating of non-catalytic material is placed over catalytic adhesive 12. For example, the non-catalytic material is composed of a thin non-catalytic adhesive or dielectric layer applied over catalytic adhesive 12. This coating can be applied, for example, using spin coating or other conventional or non-conventional processes. The thickness of the resulting non-catalytic material is, for example, in the range of approximately 0.25-1.5 mils. After application the coating can be cured thermally or can be cured using a UV process.

Figure 5:
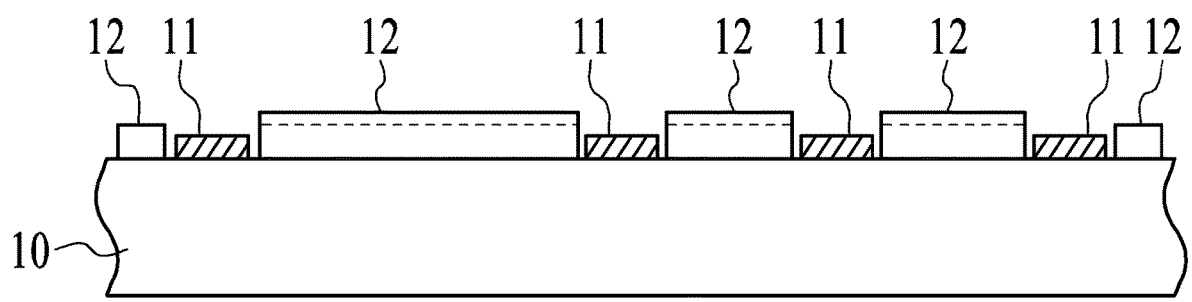

In a block 34, IC pads 11 are exposed and trace channels are formed. For example, laser ablation is used to break the surface of non-catalytic material and catalytic adhesive 12 to expose IC pads 11 and to form trace channels, as illustrated by FIG. 5. The laser ablation can be accomplished, for example, with an ultraviolet (UV) excimer laser, with a Yttrium aluminum garnet (YAG) laser, with a UV YAG laser or with some other type of laser, or alternatively, a non-laser ablation process. Excimer laser ablation creates good depth control and channel resolution.

As an alternative to using laser ablation to form channels and expose IC pads 11, resist can be applied. For example, the resist is exposed and developed to delineate locations of the trace channels and the IC pads. For example, resist thickness is thicker than the depth of the trace channels. For example, for a channel depth of 0.5 mils, resist thickness can be 1.0 to 1.5 mils. The formation of the trace channels can then be performed using plasma etching with a combination of gasses (e.g., O2, CF4, Ar, etc.) along with the proper power and duration. It is expected the channel will be etched at a different rate than the resist. For example, the resist thickness should be sufficiently thicker that the channel depth so that when the channel depth is reached there is some resist left protecting unexposed regions of the surfaces of non-catalytic material. After plasma etching, the remaining resist can be removed by a resist stripper. If needed, a separate or an additional deposit of resist and subsequent etch can be use to expose IC pads 11.

Alternatively, instead of protecting the surface with resist when performing plasma etch, other protective material can be used. For example, the protection can be accomplished using a foil, such as a copper foil or aluminum foil. The shiny side of the foil can be placed facing wafer 10 so the foil can be peeled off after channel formation. For example, after applying the foil, resist is applied over the foil. The resist is exposed/develop to expose the foil over the channel regions and/or over IC pads 11. The foil is etched to expose the channel regions and/or IC pads 11. The remaining resist is then stripped and the trace channels are plasma etched. Plasma etching can also be used to expose IC pads 11. The remaining foil is peeled off and processing continues.

Alternatively, channels can be formed using high pressure water cutting. The high pressure water cutting can be performed using programmable high pressure water cutting machines such as those used for cutting hard materials such as steel and stainless steel. Another mechanical processes such as drilling and routing can be used for making the trace channels.

A cleaning may be performed as necessary to remove debris from the trace channels. For example, a plasma clean can be used. Alternatively or in addition, the cleaning can be accomplished by an ultrasonic rinse using acoustic wave with a frequency within the range of 40 to 160 megahertz (MHz).

Figure 6:
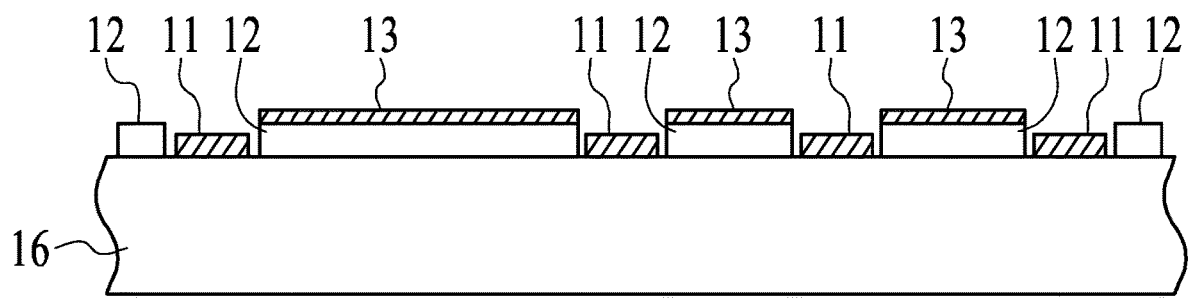

In a block 33, shown in FIG. 1, metal plating is performed to form traces 13 in the trace channels and traces over IC pads 11. This is illustrated in FIG. 6. For example, the traces are a metal such as copper. For example, to form copper traces, a fast electroless copper bath is used to coat the top surface of the wafer. The trace channels are plated all the way up and slightly above the surface of catalytic adhesive 12. The electroless copper bath plates only on the exposed catalytic areas that were exposed by the ablation process. No copper plates outside areas where the surface is ablated, scratched or roughened. As a result, copper traces form where ablation has penetrated the surface. Formation of traces can include pad areas that can be used for external connection to the traces.

If necessary, the surface can be planarized, for example, using fine grid sandpaper (e.g., 420 grit to 1200 grit), lapping, fine grinding or other planarization methods. The planarization removes any excess copper that extends above the trace channels.

When it is desirable to have one or more additional layers of traces, the process can be repeated. This is illustrated for example, by block 34 where another layer of catalytic adhesive is applied to the exposed surface, and so on, as discussed above. In a block 35, the pads are exposed and channels are formed, as further discussed above. As illustrated by block 36, this can be repeated as desired.

In a block 37 a dielectric layer is deposited. The dielectric layer functions as a solder mask. It protects the traces during further processing. For example, pads formed in the trace layers or below may be exposed using process involving lasers, ultraviolet light, etc, as is known in the art. The pads are then used as interconnect areas, for example, where solder balls, copper posts or other interconnect techniques are used to connect the wafer level packaged circuit to other circuits, such as circuits mounted on a printed circuit board (PCB).

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. A method for wafer level packaging, comprising:
   applying at least one layer of catalytic adhesive on a surface of a semiconductor wafer having conductive pads for attachment, the catalytic adhesive including catalytic particles that will reduce electroless copper (Cu) from $Cu^{++}$ to Cu, the catalytic particles comprising an inorganic filler particle coated with a catalytic metal;
   curing the catalytic adhesive;
   placing the trace channels and cured catalytic adhesive in an electroless copper bath;
   forming trace channels in the at least one layer of catalytic adhesive applied to the surface of the semiconductor wafer, including removing a portion of the catalytic adhesive to the depth of an integrated circuit conductive pad;
   wherein the electroless copper only plates on the exposed catalytic areas where the surface is broken to form the trace channels, and does not plate on areas where the surface was not broken; and,
   performing a metal plating process to form the metal traces within the trace channels and over the integrated circuit pads.

2. A method as in claim 1 wherein the metal plating process includes performing electroless copper bath.

3. A method as in claim 1 wherein the trace channels are formed using laser ablation.

4. A method as in claim 1 wherein the trace channels are formed by:
   applying resist over the catalytic adhesive;
   exposing and developing the resist to delineate locations of the trace channels; and,
   performing plasma etching to form the trace channels.

5. A method as in claim 1 wherein the trace channels are formed by:
   applying foil over the at least one layer of catalytic adhesive;
   applying resist over the foil;
   exposing and developing the resist to expose portions of the foil that delineate locations of the trace channels;

etching the exposed portions of the foil; and,
performing plasma etching to form trace channels.

6. A method as in claim 1, additionally comprising:
coating the at least one layer of catalytic adhesive with non-catalytic material before forming trace channels in the catalytic adhesive.

7. A method as in claim 1 wherein the catalytic particles includes at least one of:
palladium (Pd) particles;
iron (Fe) particles; and
silver (Ag) particles.

8. A method as in claim 1 additionally comprising:
applying a subsequent layer of the catalytic adhesive over a previous layer of the catalytic adhesive and over the metal traces;
curing the subsequent layer of the catalytic adhesive,
forming trace channels in the subsequent layer of catalytic adhesive; and,
performing a metal plating process to form metal traces within the trace channels formed in the subsequent layer of catalytic adhesive.

9. A method as in claim 1 wherein the semiconductor material is one of the following:
crystalline silicon;
gallium nitride;
gallium arsenide;
indium arsenide;
zinc selenide;
zinc sulfide;
silicon carbide;
indium selenide; and
cadmium sulfide.

10. A method for wafer level packaging, comprising:
applying at least one layer of a catalytic adhesive on a surface of a semiconductor material, the catalytic adhesive including catalytic particles that will reduce electroless copper (Cu) from $Cu^{++}$ to Cu, the catalytic particles comprising an inorganic filler particle coated with a catalytic metal;
forming trace channels in the at least one layer of catalytic adhesive applied to the surface of the semiconductor material, including removing a portion of the catalytic material through the depth of the catalytic adhesive to expose integrated circuit pads located on the surface of the semiconductor material;
placing the catalytic adhesive with trace channels into an electroless copper bath, wherein the electroless copper only plates on the exposed catalytic areas where the surface is broken to form the trace channels, and does not plate on areas where the surface was not broken;
whereby metal traces are formed within the trace channels and over the integrated circuit pads; and,
planarizing the at least one layer of catalytic adhesive so that the metal traces are flush with a surface of the at least one layer of catalytic adhesive.

11. A method as in claim 10 wherein the metal plating process includes performing electroless copper bath.

12. A method as in claim 10 wherein the trace channels are formed using laser ablation.

13. A method as in claim 10 wherein the trace channels are formed by:
applying resist over the at least one layer of catalytic adhesive;
exposing and developing the resist to delineate locations of the trace channels; and,
performing plasma etching to form the trace channels.

14. A method as in claim 10 wherein the trace channels are formed by:
applying foil over the at least one layer of catalytic adhesive;
applying resist over the foil;
exposing and developing the resist to expose portions of the foil that delineate locations of the trace channels;
etching the exposed portions of the foil; and
performing plasma etching to form the trace channels.

15. A method as in claim 10, additionally comprising:
coating the at least one layer of catalytic adhesive with non-catalytic material before forming trace channels in the catalytic adhesive.

16. A method as in claim 10 wherein the catalytic particles includes at least one of:
palladium (Pd) particles;
iron (Fe) particles; and
silver (Ag) particles.

17. A method as in claim 10 additionally comprising:
applying a subsequent layer of the catalytic adhesive over a previous layer of the catalytic adhesive and over the metal traces;
curing the subsequent layer of the catalytic adhesive,
forming trace channels in the subsequent layer of catalytic adhesive; and,
performing a metal plating process to form metal traces within the trace channels formed in the subsequent layer of catalytic adhesive.

18. A method as in claim 10 wherein the semiconductor material is one of the following:
crystalline silicon;
gallium nitride;
gallium arsenide;
indium arsenide;
zinc selenide;
zinc sulfide;
silicon carbide;
indium selenide; and
cadmium sulfide.

* * * * *